(12) United States Patent
Swain et al.

(10) Patent No.: US 7,804,113 B2
(45) Date of Patent: Sep. 28, 2010

(54) ANTI-BLOOMING STRUCTURES FOR BACK-ILLUMINATED IMAGERS

(75) Inventors: Pradyumna Kumar Swain, Princeton, NJ (US); Mahalingam Bhaskaran, Lawrenceville, NJ (US)

(73) Assignee: Sarnoff Corporation, Princeton, NJ (US)

( * ) Notice: Subject to any disclaimer, the term of this patent is extended or adjusted under 35 U.S.C. 154(b) by 535 days.

(21) Appl. No.: 11/850,250

(22) Filed: Sep. 5, 2007

(65) Prior Publication Data

US 2008/0079032 A1 Apr. 3, 2008

Related U.S. Application Data

(60) Provisional application No. 60/843,124, filed on Sep. 8, 2006.

(51) Int. Cl.
*H01L 27/148* (2006.01)
*H01L 31/18* (2006.01)

(52) U.S. Cl. ...................................... 257/228
(58) Field of Classification Search ................ 257/228, 257/223, 245, 445–447, E27.139, E27.145, 257/E27.162, 219, 225, 239, 240, 241, 246, 257/E27.082–E27.065, E29.227–E29.24, 257/E21.185, E21.189, E21.456–E21.458, 257/E21.617; 438/60, 75, 144
See application file for complete search history.

(56) References Cited

U.S. PATENT DOCUMENTS 4,774,557 A * 9/1988 Kosonocky ................. 257/222
4,975,777 A 12/1990 Lee et al.
5,619,049 A * 4/1997 Kim ............................ 257/223
6,504,193 B1 * 1/2003 Ishiwata et al. ............. 257/291
6,858,460 B2 * 2/2005 Rhodes et al. ................ 438/60
7,074,639 B2 7/2006 Burke et al.
2005/0274996 A1 * 12/2005 Iwawaki ..................... 257/292
2008/0217724 A1 * 9/2008 Uya ............................ 257/460

* cited by examiner

*Primary Examiner*—Dao H Nguyen
*Assistant Examiner*—Tram H Nguyen
(74) *Attorney, Agent, or Firm*—Lowenstein Sandler PC

(57) ABSTRACT

An anti-blooming structure for a back-illuminated imager is disclosed. In one embodiment, the anti-blooming structure is formed in a substrate of a first conductivity type having a back side and a front side, comprising a channel region of a second conductivity type formed in the substrate; a barrier region of the first conductivity type positioned in the substrate substantially overlying the channel region and proximal to the front side of the substrate; and a drain region of the second conductivity type positioned substantially overlying the barrier region, wherein when light impinges on the back side of the substrate the light generates charge carriers that collect in the channel region, the charge carriers passing through the barrier region into the drain region when a potential corresponding to the collected charge carriers in the channel region is about equal to the potential corresponding to the barrier region. In a second embodiment, a drain region of the second conductivity type is positioned substantially extending into at least a portion of the front side of the substrate; a barrier region of the first conductivity type positioned substantially underlying about the drain region; and a channel region of the second conductivity type positioned substantially underlying and about the barrier region. The channel region, the barrier region, and the drain region are formed by ion implantation.

11 Claims, 7 Drawing Sheets

ANTI-BLOOMING STRUCTURES FOR BACK-ILLUMINATED IMAGERS

CROSS-REFERENCE TO RELATED APPLICATIONS

This application claims the benefit of U.S. provisional patent application No. 60/843,124 filed Sep. 8, 2006, the disclosure of which is incorporated herein by reference in its entirety.

FIELD OF THE INVENTION

The field of the present invention is semiconductor device fabrication and device structure. More specifically, the present invention relates to anti-blooming structures used in back illuminated imagers.

BACKGROUND OF THE INVENTION

CMOS or CCD image sensors are of interest in a wide variety of sensing and imaging applications in a wide range of fields including consumer, commercial, industrial, and space electronics. CCDs are employed either in front or back illuminated configurations. Front illuminated CCD imagers are more cost effective to manufacture than back illuminated CCD imagers such that front illuminated devices dominate the consumer imaging market. Front-illuminated imagers, however, have significant performance limitations such as low fill factor/low sensitivity. The problem of low fill factor/low sensitivity is typically due to shadowing caused by the presence of opaque metal bus lines, and absorption by an array circuitry structure formed on the front surface in the pixel region of a front-illuminated imager. Thus, the active region of a pixel is typically very small (low fill factor) in large format (high-resolution) front-illuminated imagers.

An effect called blooming can occur with CCD imagers. CCD imagers are most often constructed of a p or n type semiconductor substrate with a plurality of overlying pixel structures, wherein each pixel is comprised of a channel of a second conductivity type different from the substrate, and one or more gates overlying the channel. Light incident on the front surface of front-illuminated CCD devices, or on the back surface of back-illuminated CCD devices, cause charge carriers to form in the substrate. These charge carriers migrate to the channel regions of the pixel structures, where they collect in response to potentials applied to one or more gates associated with the pixel structure. As charge accumulates, the channel well under a collecting gate begins to "fill" or approach a saturation state. The charge stored in the channel is sometimes said to be stored in the "charge well" located underneath the gate overlying the semiconductor substrate. Bright sources of light can cause so many carriers to be generated in the channel region that the charge-holding capacity of a pixel can be exceeded. As a light-gathering capacity of a pixel channel is exceeded, the excess charge carriers spill over into adjacent pixels. This spillover, called "blooming."

Referring now to FIGS. 1A-1C, a technique in the prior art for reducing or eliminating blooming in a conventional back illuminated CCD imagers is depicted. FIG. 1A is a top-down view of the back-illuminated imager with anti-blooming drain structures. FIG. 1B shows a cross-section of the back-illuminated CCD imager which depicts the structure of a single pixel 2. FIG. 1C shows a simulated channel potential profile (gate biased) for the pixel 2. Referring now to FIG. 1A and 1B, the CCD pixel 2 includes a portion of a silicon substrate 4 of a first conductivity type, with an overlying channel region 6 of a second conductivity type different from the first conductivity type. One or more gates 13 can overlay the channel region 6 separated by anti-blooming structures 8 on each side of the channel region 6. Each of the anti-blooming blooming structures 8 comprises a barrier region 10 of the first conductivity type surrounding a drain region 12 of the second conductivity type. Gates 13 run horizontally overlying a channel oxide layer 14 for isolating the conductive gates 13 from the underlying channel region 6.

Charges generated in a backside 15 of the substrate 4 are confined in the channel 6 by an application of appropriate potentials to the gates 13. Initially, when there is no accumulated charge in the channel region 6, the channel potential 16 in FIG. 1C will be high. Barrier region potentials 18 will be low, and drain region potentials 20 will be high. As charge accumulates in the channel region 6, the channel potential 16 decreases. At some point, the channel potential 16 will be level with the barrier region potentials 18, such that charges spill into the drain regions 12. The drain regions 12 are electrically connected together (not shown) and the resulting drain current, is removed from the CCD imager.

As can be seen in FIGS. 1A and 1B, the anti-blooming structure of the prior art can be implemented in a back-illuminated imager at the expense of useful pixel width. Such lateral anti-blooming structures take real-estate away from the top-portions of CCD imagers which could be used for additional pixel structures. But, as the demand for pixel density increases, there is greater need in the industry for reduced pixel width, and therefore, incorporation of lateral anti-blooming structures in back-illuminated imagers becomes physically prohibitive.

A cross-section of a front-illuminated imager in the prior art with anti-blooming structures moved away from the imaging-component upper-portions of a silicon substrate is shown in FIG. 2. The front-illuminated CCD pixel 22 includes a portion of a silicon substrate 24 of a first conductivity type, with a drain region 26 of a second conductivity type different from the first conductivity type overlaying a top portion of the substrate 24. The drain region 26 is created by an ion implantation. The ion implantation is performed at a high energy (in the order of MeV), so that the drain region 26 thus created is deeply buried in the bulk of the substrate 24. A barrier region 28 of the first conductivity type substantially overlays the buried drain 26 and is also created by means of ion implantation. Here, the energy of the ion implantation is higher than but not greater than the energy used for the ion implantation step for creating the drain region 26. As a result, the barrier region 28 overlays the drain region 26. A channel region 30 of the second conductivity type, also created by ion implantation, substantially overlays the barrier region 28. One or more gates (not shown) can overlay the channel region 30. A pixel isolation region 32, also created by ion implantation and a drain contact 34 separate channel and barrier regions of adjoining pixels and also serves to separate the channel region 30 from the drain region 26. The drain contact 36 comes in direct contact with at least a portion of the drain region 26.

Light impinging on the front side 38 of the pixel 22 creates charge carriers which migrate to the channel region 30. The charge carriers are located in the channel region 30 because the pixel isolation region 32 provides an electrical barrier to the charge carriers stored in the channel region 30. In a similar fashion, the barrier region 28 initially provides an electrical barrier to the charge carriers confined in the channel region 30. However, as charge carriers accumulate in the channel region 30, channel potential collapses, and an instant in time is reached when the channel potential is level with the barrier potential. From that point onwards, any further accumulated carriers will overcome the barrier potential, and move to the drain region 26. The excess charge carriers in the drain region 26 are collected as a drain current through the drain contact 36.

Unfortunately, this structure is of no use for a back-illuminated CCD imager. Using the front-illuminated imager structure of FIG. 2 as a guide, in a back illuminated CCD imager, light incident on the back side 40 of the imager generates carriers in the silicon substrate 24 that are siphoned away by a buried drain implant 26 before these carriers could reach a front side channel region 30.

Accordingly, what would be desirable, but has not yet been provided, is an anti-blooming structure for use in back illuminated imager array which does not share valuable front-side real estate with carrier-collecting drain regions.

SUMMARY OF THE INVENTION

Disclosed is an anti-blooming structure for a back-illuminated imager formed in a substrate of a first conductivity type having a back side and a front side, comprising a channel region of a second conductivity type formed in the substrate; a barrier region of the first conductivity type positioned in the substrate substantially overlying said channel region and proximal to the front side of the substrate; and a drain region of the second conductivity type positioned substantially overlying the barrier region, wherein when light impinges on the back side of the substrate the light generates charge carriers that collect in the channel region, the charge carriers passing through the barrier region into the drain region when a potential corresponding to the collected charge carriers in the channel region is about equal to the potential corresponding to the barrier region.

In a second embodiment, an anti-blooming structure for a back-illuminated imager formed in a substrate of a first conductivity type having a back side and a front side comprises a drain region of the second conductivity type positioned substantially extending into at least a portion of the front side of the substrate; a barrier region of the first conductivity type positioned substantially underlying and about the drain region; and a channel region of the second conductivity type positioned substantially underlying and about the barrier region; wherein when light impinges on the back side of the substrate the light generates charge carriers that collect in the channel region, the charge carriers passing through the barrier region into the drain region when a potential corresponding to the collected charge carriers in the channel region is about equal to the potential corresponding to the barrier region. The channel region, the barrier region, and the drain region are formed by ion implantation.

The first type of anti-blooming structure can be used in frame transfer CCD array structures, wherein the channel region, barrier region, and drain region extent substantially overlying the entire imaging store area and the frame storage area. The boundary between the imaging store area and the frame storage area comprise a plurality of charge collecting gates/regions separated by inter gate dielectrics from a plurality of charge transfer gates/regions. In order to prevent smear, charge carriers generated in the substrate can be diverted away from charge transfer gates by ion implanting an electrical barrier region of the first conductivity type in the semiconductor substrate substantially underlying the charge transfer gates. The electrical barrier region can underlay the transfer gates in the substrate for the entire frame storage area.

The second type of anti-blooming gain structure can be used in line transfer CCD array structures, wherein the channel region overlies the entire substrate, but the drain barriers and drain regions are formed separately in each charge collecting region pixel. As with frame transfer CCD array structures, in line transfer CCD array structures, charge carriers generated in the substrate can be diverted away from charge transfer gates by ion implanting an electrical barrier region of the first conductivity type in the semiconductor substrate substantially underlying the charge transfer gates.

SUMMARY DESCRIPTION OF THE DRAWINGS

DETAILED DESCRIPTION OF THE INVENTION

The following embodiments are intended as exemplary, and not limiting. In keeping with common practice, figures, are not necessarily drawn to scale.

Figure 1A:
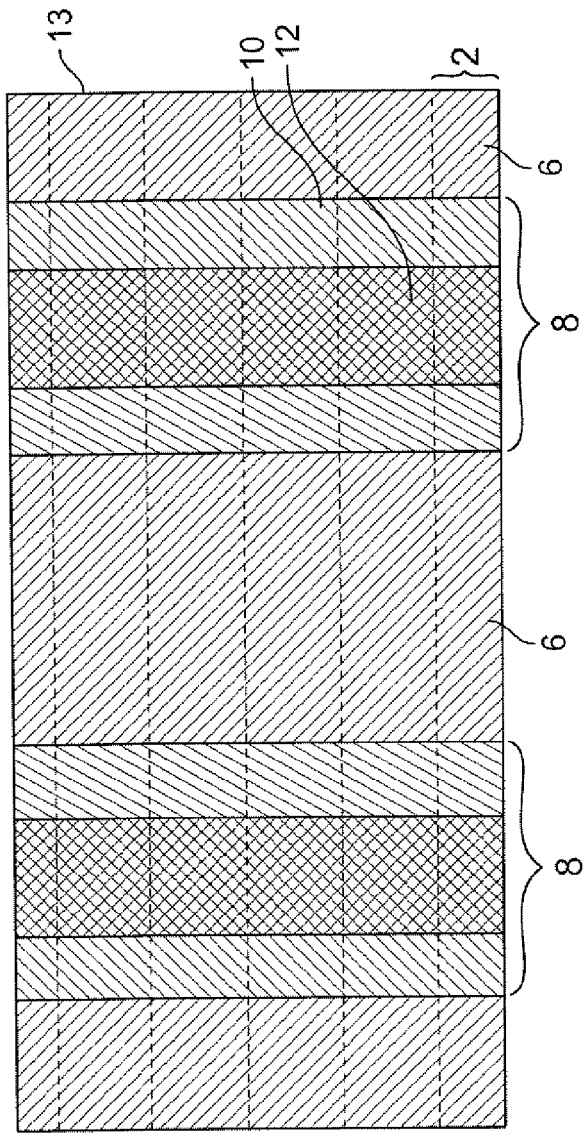
FIG. 1A is a top-down view of a prior art back-illuminated imager with lateral anti-blooming drain structures.
Figure 1B:
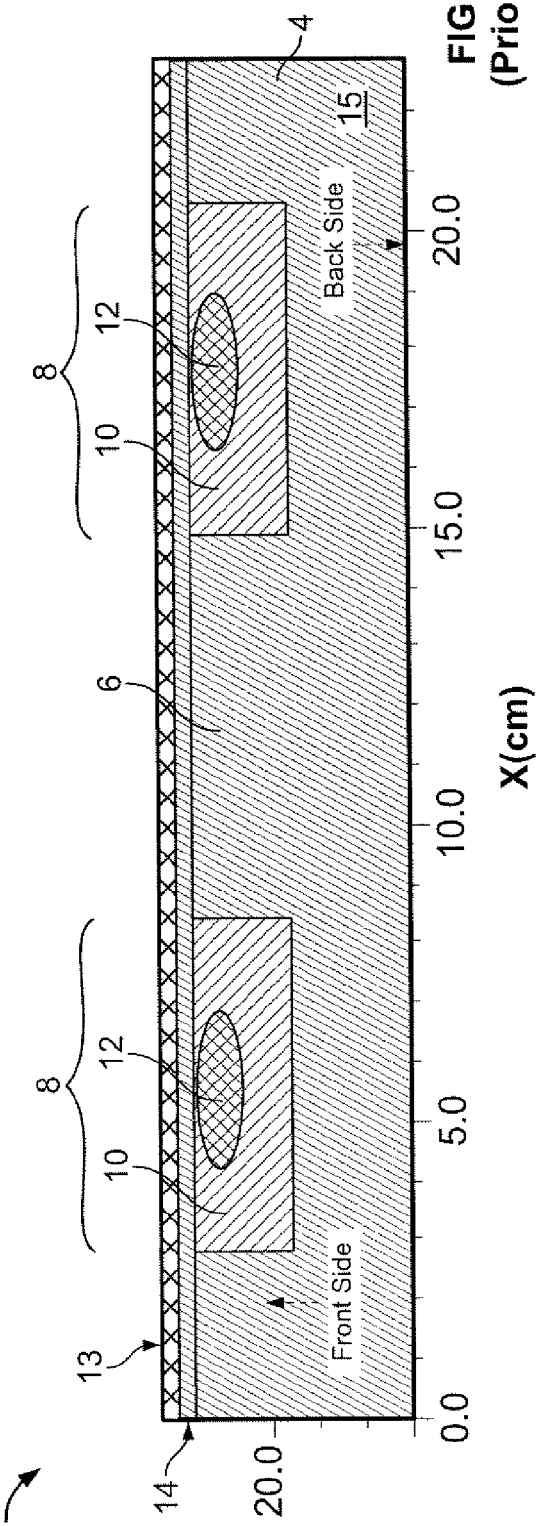
FIG. 1B shows a cross-section of the back-illuminated CCD imager of FIG. 1A which depicts the structure of a single pixel.
Figure 1C:
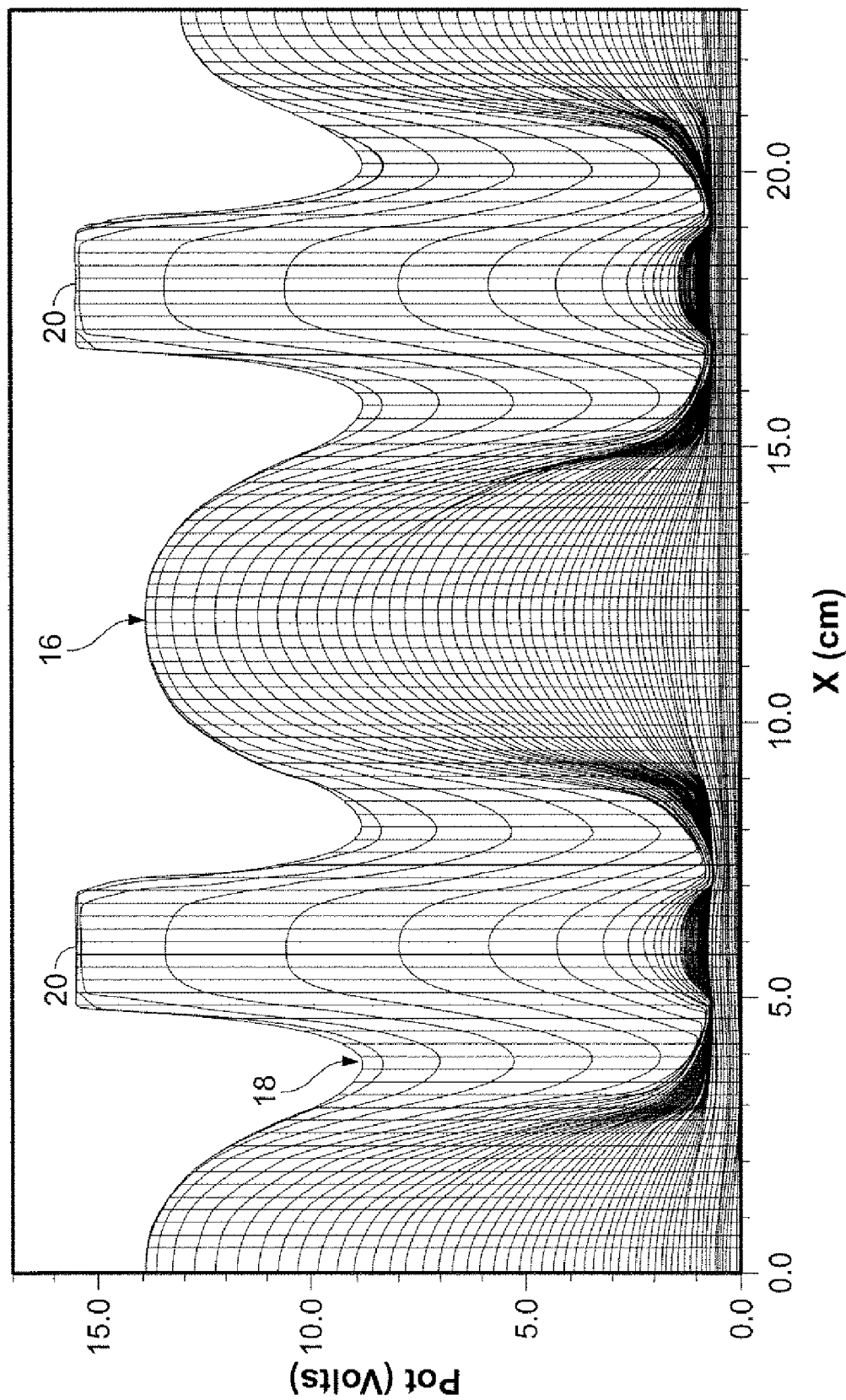
FIG. 1C shows a simulated channel potential profile for the pixel of FIG. 2 with no charge collected.
Figure 2:
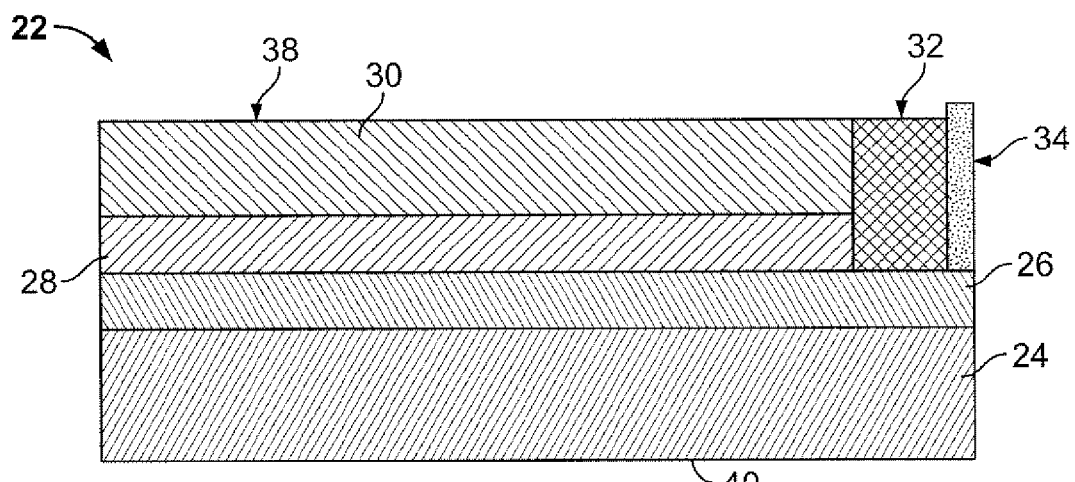
FIG. 2 is cross-section of a front-illuminated imager in the prior art with anti-blooming structures moved away from the imaging-component upper-portions of a silicon substrate.
Figure 3A:
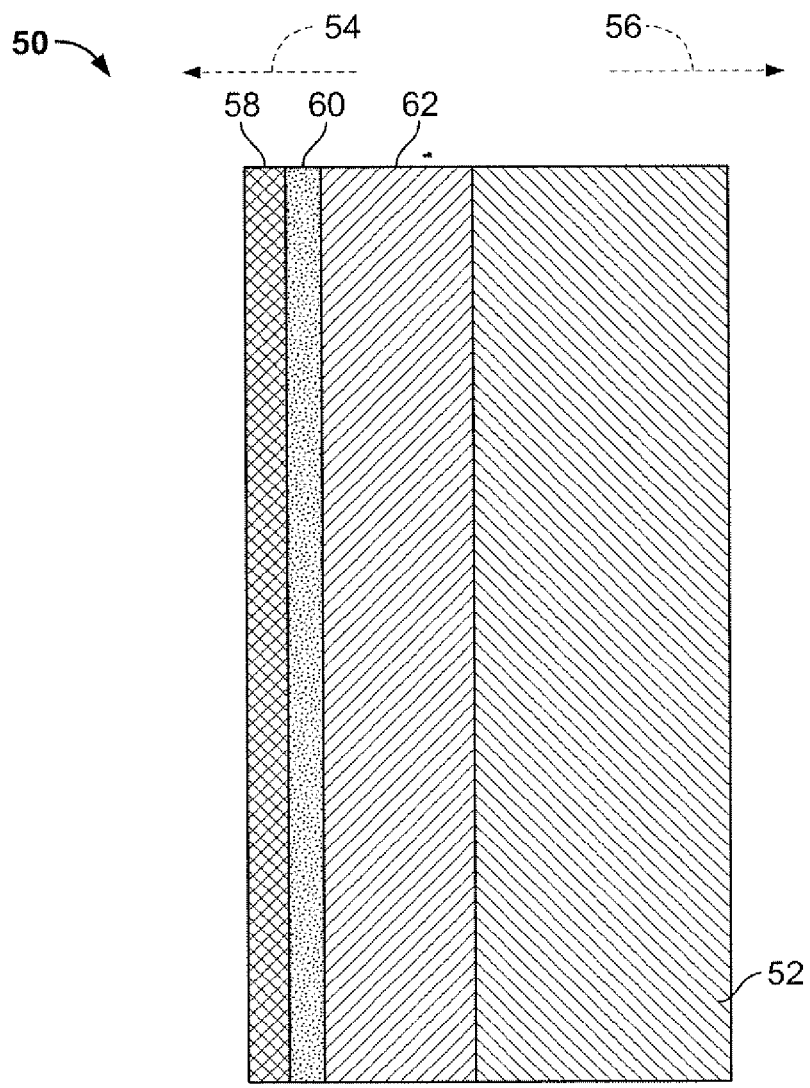
FIG. 3A is a cross section of an anti-blooming drain structure incorporated into a back-illuminated imager structure, constructed in accordance with an embodiment of the present invention.
Figure 3B:
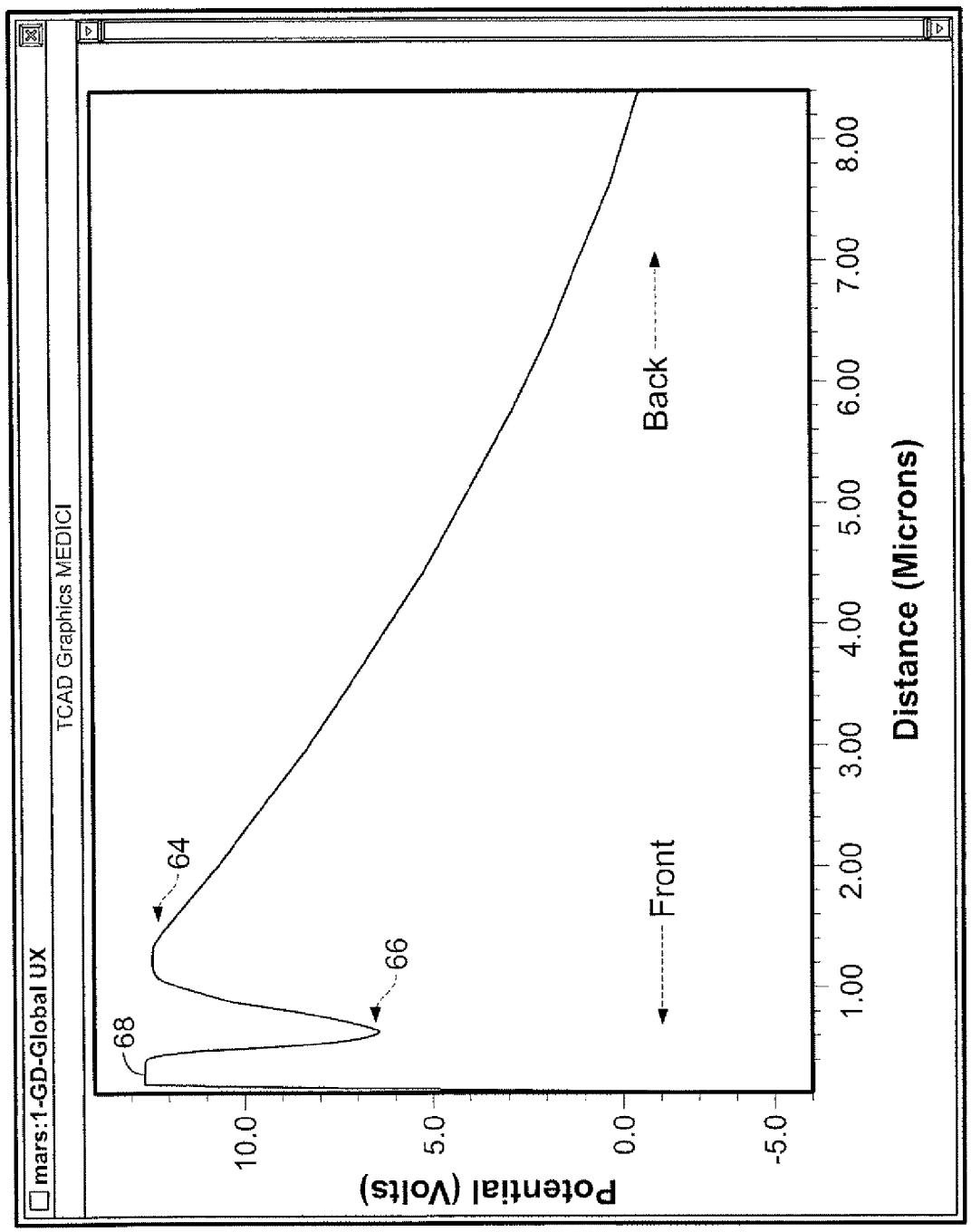
FIG. 3B shows a simulated channel potential profile for a pixel constructed formed in the device of FIG. 3A with no charge collected.

A cross section of an anti-blooming drain structure incorporated into a back-illuminated imager structure (e.g. CCD or CMOS), constructed in accordance with an embodiment of the present invention is depicted in FIG. 3A, which is juxtaposed with a simulated bulk potential profile in FIG. 3B. As with the front-side CCD structure of FIG. 2, the back-illuminated imager structure 50 of the present invention is formed in a portion of a bulk semiconductor substrate 52, preferable made of but not limited to silicon. The semiconductor substrate 52 having a front side 54 and a back side 56 is doped to be of a first conductivity type (e.g., p-type). A drain region 58 of the second conductivity type (e.g., n+) can be formed by low energy ion implantation at least partially underlying a portion of the back side 56 of the silicon substrate 52. A barrier region 60 of the first conductivity type can be formed by an intermediate energy ion implantation at least partially underlying the drain region 58. A channel region 62 of a second conductivity type (e.g., n) is formed deep inside the bulk semiconductor substrate 52 substantially underlying the barrier region 60 via high energy ion implantation. The regions 58, 60, 62 can be formed by ion implantation in any order in the semiconductor substrate 52, so long as the proper implantation energy and net doping profile are attained. Although the doping profiles are described in terms of a p-type substrate and corresponding regions of a first or second conductivity type with electron carriers, a person skilled in the art would appreciate that the opposite type of carrier (holes) and similar regions of the appropriate net doping type can be formed using an n-type doped semiconductor substrate. One or more gates (not shown) can overlay the drain region 58. A drain contact (not shown) is electrically connected with at least a portion of the drain region 58. The drain contact can be biased at constant value for the removal of excess charge carriers to be described hereinbelow.

Light impinging on the back side 56 of the imager structure 50 creates charge carrier which migrate to the channel region 62. The charges are accumulate in the channel region 62 because the barrier region 60 initially provides an electrical barrier to the charges confined in the channel region 62. Initially, when there is no accumulated charge in the channel region 62, the channel potential 64 in FIG. 3B will be high. Barrier region potential 66 will be low, and drain region potentials 68 will be high. However, as more charges accumulate in the channel region 62, channel potential 64 collapses, and an instant in time is reached when the channel potential 64 is level with the barrier potential 66. From that point onwards, any further accumulated carriers will overcome the barrier potential, and move to the drain region 58. The excess charges in the drain region 58 is collected as a drain current through the drain contact.

Figure 4:
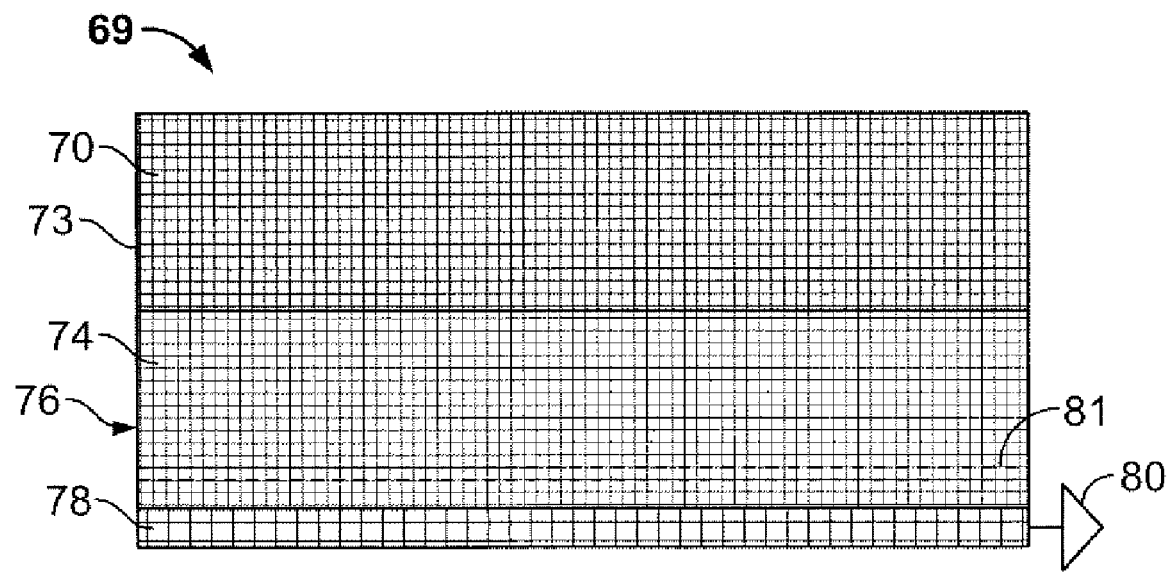
FIG. 4 shows a top plan view of a frame transfer CCD array employing the anti-blooming drain structure of FIG 3 A.

FIG. 4 shows a top plan view of a frame transfer CCD array 69 employing the anti-blooming drain structure of the present invention. The frame transfer CCD array 69 comprises an array of pixels 70 forming a charge-collecting region 72, and an array of equal number of pixels 74 forming a frame storage region 76. The frame transfer CCD array 69 also includes a horizontal line transfer register 78, and output amplifier circuits 80. During an image integration period, photo generated carriers can be collected in each of the pixels 70 of the charge collecting region 72 via potentials applied to one or more overlying gates (not shown). At the end of the image integration period, charge packets collected in each of the pixels 70 of the entire pixel array of the collecting region 72 are transferred to corresponding pixels 74 of the frame storage region 76 via appropriate potentials applied to the or more gates. During the subsequent image integration period, the charges stored in each line 81 of the frame storage region 76 are collected in the horizontal line transfer register 78. Charge packets stored in the horizontal line transfer register 78 are then moved to the amplifier circuits 80. The amplifier circuits 80 convert each charge packet to a voltage signal which are then converted to a digital signal (not shown).

Figure 5:
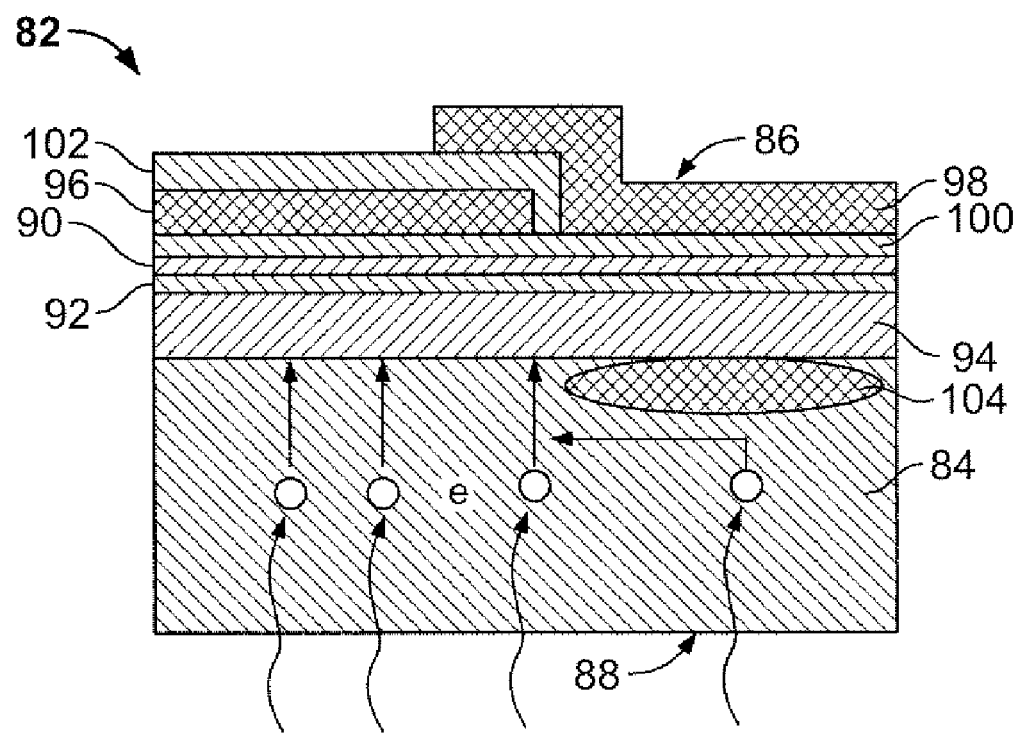
FIG. 5 shows a cross-sectional view of a frame transfer CCD imager structure in the vicinity of the border between a charge-collecting region and the frame storage region.

FIG. 5 shows a cross-sectional view of the frame transfer CCD imager structure 82 in the vicinity of the border between the charge-collecting region 72 and the frame storage region 76 of FIG. 4. The frame transfer CCD imager structure 82 employs the same anti-blooming structure described previously in FIG. 3 As with the CCD imager structure of FIG. 3, the frame transfer CCD imager structure 82 is formed in a portion of a bulk semiconductor substrate 84, preferable made of but not limited to silicon. The semiconductor substrate 84 having a front side 86 and a back side 88 is doped to be of a first conductivity type (e.g., p-type). A drain region 90 of the second conductivity type (e.g., n+) can be formed by low energy ion implantation extending into at least a portion of the front side 86 of the silicon substrate 84. A barrier region 92 of the first conductivity type can be formed by an intermediate energy ion implantation substantially underlying the drain region 90. A channel region 94 of a second conductivity type (e.g. n) is formed deep inside the bulk semiconductor substrate 84 substantially underlying the barrier region 92 via high energy ion implantation. A plurality of charge collecting gates 96 in the charge-collecting region 72 (see FIG. 4) of the frame transfer CCD imager structure 82 and a plurality of charge transfer gates 98 in the frame storage region 76 of the frame transfer CCD imager structure 82 can substantially overlay the drain region 90. A gate dielectric 100 substantially overlays the entire channel region 94 to electrically isolate the drain region 90 from the overlaying gates 96, 98. To allow for a continuous transfer of charge, successive gates overlap preceding gates. In FIG. 5, one of the plurality of charge transfer gates 98 is shown at least partially overlapping one of the plurality of charge collection gates 96. Overlapping gates 96, 98 are electrically separated from each other by an intervening inter gate dielectric 102.

One of the concerns in implementing such anti-blooming structures in back illuminated devices is the collection of charge in undesirable areas. Typically in any CCD imager architecture, a CCD imager comprises one or more charge-sensing regions where photo-generated charge carriers will be collected, and a charge transfer region where charge packets will be moved to output amplifier circuits. In the back-illuminated CCD imager devices, since light can fall on the entire back surface of the device, charge carriers can be generated anywhere in the bulk semiconductor substrate. However, these carriers should end up only in the charge collection region. Charges should be prevented from entering into charge transfer regions under transfer gates. Otherwise, photo generated carriers accumulating under the charge transfer gates will ultimately contribute heavy noise to the resulting image, which is referred to as the phenomenon called smear.

In the present invention as depicted in FIG. 5, charge carriers can be prevented from collecting under charge transfer gates 98 by forming an electrical barrier region 104 of the first conductivity type deep inside the bulk semiconductor substrate 84 by ion implantation substantially underlying the transfer gates 98. For the frame transfer CCD imager structure 82, the electrical barrier region can be formed substantially underlying the entire frame storage region 76 (see FIG. 4). In this way, charges coming from the back side 88 drift towards the charge-collecting region 72 underlying the collecting gates 96.

Figure 6:
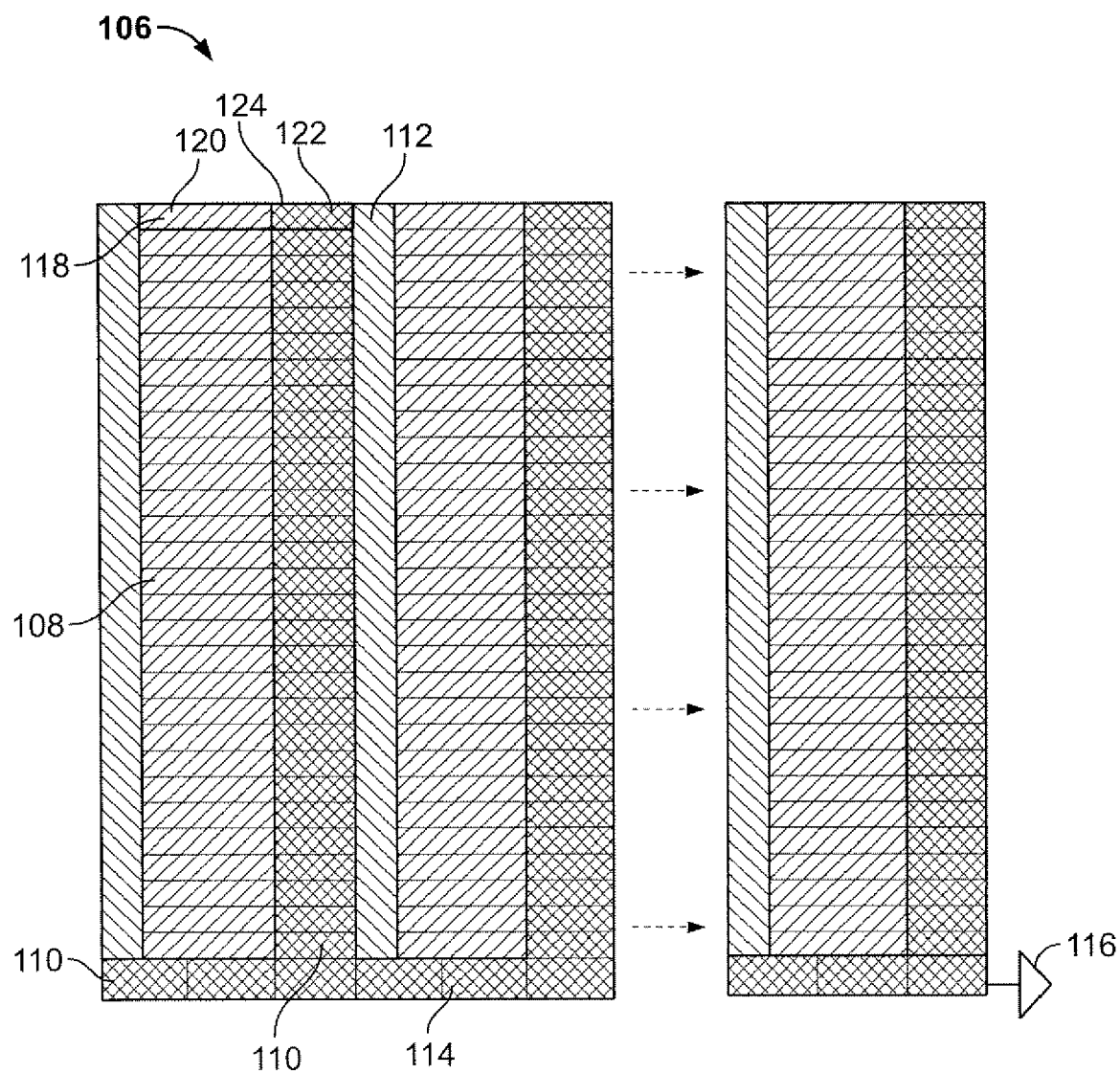
FIG. 6 is a top plan view of a line transfer CCD array structure employing an anti-blooming drain structure, constructed in accordance with a second embodiment of the present invention.

FIG. 6 shows a top plan view of a line transfer CCD array structure 106 employing an anti-blooming drain structure, constructed in accordance with a second embodiment of the present invention. The line transfer CCD array structure 106 comprises a charge-collecting region 108 and a charge transfer region 110 separate from the charge-collecting region 108 by a channel stop region 112. Like the frame transfer CCD array structure 82 of FIG. 4, the line transfer CCD array structure 106 includes a horizontal line transfer register 114, and output amplifier circuits 116. The vertical charge collection region 108 and the vertical charge transfer region 110 are constructed of a plurality of horizontally aligned pixels 118 comprising charge collection portions 120 and charge transfer portions 122 having one or more overlying charge transfer gates 124. During an image integration period, photo generated carriers can be collected in each of the charge collection portions 120 of the pixels 118. After the integration time period, the collected charges (or charge packet) are transferred to the charge transfer portions 122 of the pixels 118 under the transfer gates 124 by a clocking signal. Then charge packets can be moved to the horizontal line transfer register 114 and thence to the output amplifier circuits 116 by another sequential clocking signal. The amplifier circuits 116 convert each charge packet to a voltage signal which are then converted to a digital signal (not shown).

Figure 7A:
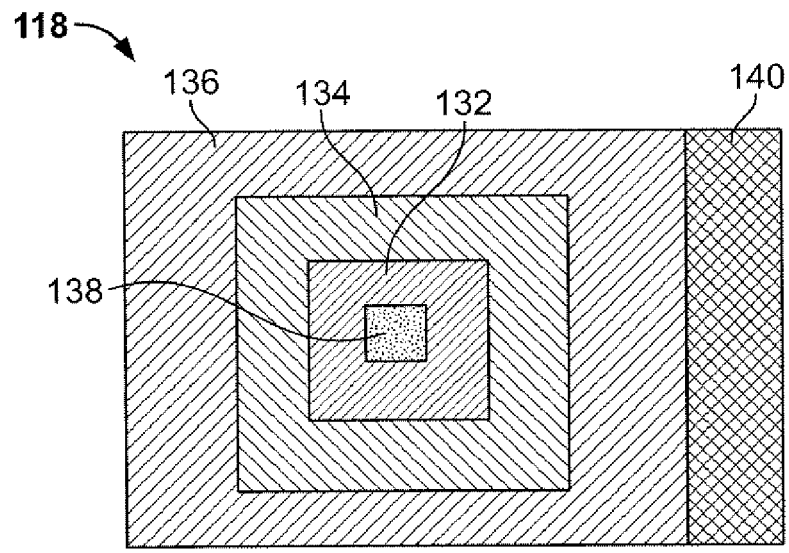
FIG. 7A shows a top plan view of one of the pixels of the line transfer CCD array structure of FIG. 6.
Figure 7B:
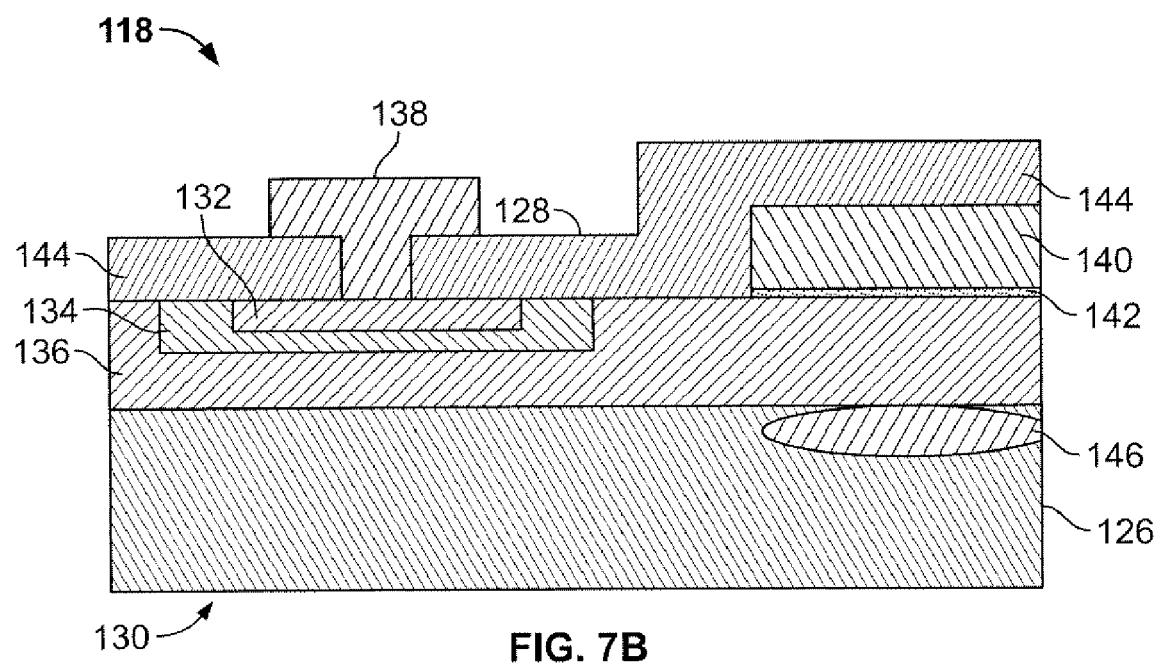
FIG. 7B is across-sectional view of the pixel structure of FIG. 7A.

FIG. 7A shows a top plan view of one of the pixels 118, while FIG. 7B shows a cross-sectional view of the same pixel structure of FIG. 7A. The line transfer CCD array of FIGS. 7A and 7B employs an anti-blooming structure constructed in accordance with the second embodiment of the present invention. As with the CCD imager structure of FIGS. 3 and 5, the line transfer CCD imager structure 106 is formed in a portion of a bulk semiconductor substrate 126, preferable made of but not limited to silicon. The semiconductor substrate 126 having a front side 128 and a back side 130 is doped to be of a first conductivity type (e.g., p-type). Using photolithography, a drain region 132 of the second conductivity type (e.g., n+) can be formed by low energy ion implantation substantially extending into at least a portion of the front side 128 of the silicon substrate 126. A barrier region 134 of the first conductivity type can be formed by an intermediate energy ion implantation substantially underlying and about the drain region 132. A channel region 136 of a second conductivity type (e.g. n) is formed deep inside the bulk semiconductor substrate 126 substantially underlying and about the barrier region 134 via high energy ion implantation. A drain contact 138 at least partially overlays the drain region 132. A charge transfer gate 140 can be formed overlying the channel region 136 proximal to the drain barrier region 134. A gate dielectric 142 substantially underlies the charge transfer gate 140 to electrically isolate the latter from the underlying channel region 136. An inter-metal dielectric 144 substantially overlies the charge transfer gate 140, the drain region 132, and the barrier region 134, and at least partially underlies the drain contact 138. Unlike the frame transfer CCD structure of FIG. 5, there are a plurality of individual drain regions 132 and barrier regions 134, one for each of the plurality of pixels 118, while a single channel region 136 can extend throughout the entire vertical charge collection region 108 and the vertical frame storage region 110 underlying all of the pixels 118.

As with the frame transfer CCD imager structure 82 of FIGS. 4 and 5, for the line transfer CCD imager structure 106 of the present invention as depicted in FIG. 7B, charge carriers are prevented from collecting in tire vertical charge transfer region 110 by forming an electrical barrier region 146 of the first conductivity type (e.g., n+) deep inside the bulk semiconductor substrate 106 by ion implantation substantially underlying the transfer gates 140. For the line transfer CCD imager structure 106, the electrical barrier region 142 can be formed substantially underlying the entire vertical charge transfer region 110 (see FIG. 7B). In this way, charges coming from the back side 130 can drift towards the charge-collecting region 108.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed:

1. An anti-blooming structure for a back-illuminated imager formed in a substrate of a first conductivity type having a back side and a front side, comprising:
   a channel region of a second conductivity type formed in the substrate;
   a barrier region of the first conductivity type positioned in the substrate substantially overlying said channel region and proximal to the front side of the substrate; and
   a drain region of the second conductivity type positioned substantially overlying said barrier region,
   wherein when light impinges on the back side of the substrate the light generates charge carriers that collect in the channel region, the charge carriers passing through the barrier region into the drain region when a potential corresponding to the collected charge carriers in the channel region is about equal to the potential corresponding to the barrier region;
   at least one charge collecting gate at least partially overlying the drain region; and
   at least one charge transfer gate at least partially overlying the drain region proximal to the at least one charge collection gate.

2. The anti-blooming structure of claim 1, wherein the channel region, the barrier region, and the drain region are formed by ion implantation.

3. The anti-blooming structure of claim 1, wherein the charge transfer gate at least partially overlaps the at least one charge collection gate.

4. The anti-blooming structure of claim 1, further comprising an electrical barrier region of the first conductivity type formed by ion implantation in the substrate substantially underlying the at least one charge transfer gate for diverting charge carriers away from the at least one charge transfer gate.

5. The anti-blooming structure of claim 4, further comprising a gate dielectric at least partially overlying the channel region and substantially underlying both the at least one charge collection gate and the at least one charge transfer gate.

6. The anti-blooming structure of claim 5, further comprising inter gate dielectric separating the at least one charge collection gate from the at least one charge transfer gate.

7. An anti-blooming structure for a back-illuminated imager formed in a substrate of a first conductivity type having a back side and a front side, comprising:
   a drain region of the second conductivity type positioned substantially extending into at least a portion of the front side of the substrate;
   a barrier region of the first conductivity type positioned substantially underlying and about the drain region; and
   a channel region of the second conductivity type positioned substantially underlying and about the barrier region;
   wherein when light impinges on the back side of the substrate the light generates charge carriers that collect in the channel region, the charge carriers passing through the barrier region into the drain region when a potential corresponding to the collected charge carriers in the channel region is about equal to the potential corresponding to the barrier region;
   overlying the channel region and proximal to the drain barrier region; and
   an electrical barrier region of the first conductivity type formed by ion implantation in the substrate substantially underlying the at least one charge transfer gate for diverting charge carriers away from the at least one charge transfer gate.

8. The anti-blooming structure of claim 7, wherein the channel region, the barrier region, and the drain region are formed by ion implantation.

9. The anti-blooming structure of claim 7, further comprising a gate dielectric at least partially overlying the channel region and substantially underlying the at least one charge transfer gate.

10. The anti-blooming structure of claim 9, further comprising a drain contact at least partially overlying the drain region.

11. The anti-blooming structure of claim 10, further comprising an inter-metal dielectric substantially overlying the charge transfer gate, the drain region, and the barrier region, and at least partially underlying the drain contact.

* * * * *